United States Patent [19]

Chu et al.

[11] 3,769,528

[45] Oct. 30, 1973

[54] LOW POWER FET DRIVER CIRCUIT

[75] Inventors: William M. Chu, Poughkeepsie; James M. Lee, Wappingers Falls; George Sonoda, Poughkeepsie, all of N.Y.

[73] Assignee: International Business Machines Corporation, Armonk, N.Y.

[22] Filed: Dec. 27, 1972

[21] Appl. No.: 319,093

[52] U.S. Cl. .................. 307/270, 307/293, 307/279

[51] Int. Cl. .............................................. H03k 1/00

[58] Field of Search .................... 307/205, 214, 251, 307/270, 279, 293, 304

[56] References Cited

UNITED STATES PATENTS

| | | | |
|---|---|---|---|
| 3,564,290 | 2/1971 | Sonoda | 307/251 |
| 3,601,624 | 8/1971 | Hayes | 307/270 |
| 3,646,369 | 2/1972 | Fujimoto | 307/270 |
| 3,660,684 | 5/1972 | Padgett | 307/270 |
| 3,679,913 | 7/1972 | Foltz | 307/293 |
| 3,732,442 | 5/1973 | Husbands | 307/293 |

*Primary Examiner*—John W. Huckert
*Assistant Examiner*—Ro E. Hart
*Attorney*—Theodore E. Galanthay et al.

[57] ABSTRACT

Disclosed is an FET (field effect transistor) driver circuit capable of driving large capacitive loads, while dissipating relatively little power. A delay circuit forms a parallel path between the circuit input and output providing a delayed signal at the output of the circuit after the gate to source feedback capacitor of the output FET has been charged. The particular delay circuit disclosed herein accurately tracks the driver circuit providing a precise time delay for limiting transient power dissipation in high frequency operation.

4 Claims, 4 Drawing Figures

LOW POWER FET DRIVER CIRCUIT

CROSS-REFERENCES TO RELATED PUBLICATIONS, PATENT APPLICATIONS AND PATENTS

J. M. Lee and G. Sonoda, "Low Power Dissipation FET Driver Circuit", IBM, TDB, Vol. 14, No. 4, Sept. 1971, p. 1084.

Sonoda U. S. Pat. No. 3,564,290, issued Feb. 16, 1971.

BACKGROUND OF THE INVENTION

Field of the Invention

This invention relates to field effect transistor driver circuits and more particularly to a delay circuit in electrical parallel with the driver circuit for improving performance and limiting power dissipation.

DESCRIPTION OF THE PRIOR ART

The most pertinent known prior art is the cross referenced publication by the inventors of the present application. This publication teaches the broad concept of using a delay circuit in electrical parallel with the driver circuit in order to drive large loads while dissipating relatively little power. Effectively, the delay circuit prevents the output from going to an up level until the feedback capacitor connected in the gate to source path of the output FET is charged. For high frequency operation, however, a precisely controlled delay circuit that tracks the delay in the driver circuit is required for limiting transient power dissipation.

SUMMARY OF THE INVENTION

Accordingly, it is an object of this invention to provide an improved FET driver circuit having a precisely controllable delay circuit that tracks the delay in the driver circuit.

It is another object of this invention to provide an improved delay circuit suitable for high frequency operation and limited transient power dissipation in an FET driver circuit.

In accordance with the present invention, a delay circuit is placed in electrical parallel with an FET driver circuit between the input and output nodes. The parallel delay path includes field effect transistors corresponding to the field effect transistors in the driver circuit for accurate tracking. The delay circuit includes an input circuit consisting of two field effect transistors for receiving the true and complement values of the signal on the input node of the driver circuit. The output of the input circuit is connected to an inverter and also to a pair of field effect transistors forming a series path for discharging the output node of the delay circuit. The output of the inverter is connected to a first FET for charging the output node of the delay circuit and a second FET for charging a common connection between the pair of FETs forming the discharge path for discharging the output node. By tailoring the width to length ratios of the gate regions of selected ones of the FETs in the delay circuit, a precisely controlled time delay is obtained. The delayed output of the delay circuit conditions an additional FET which is connected to the output node of the driver circuit.

The foregoing and other objects, features and advantages of this invention will be apparent from the following more particular description of preferred embodiments of the invention, as illustrated in the accompanying drawing.

DESCRIPTION OF THE PREFERRED EMBODIMENT

Figure 1:
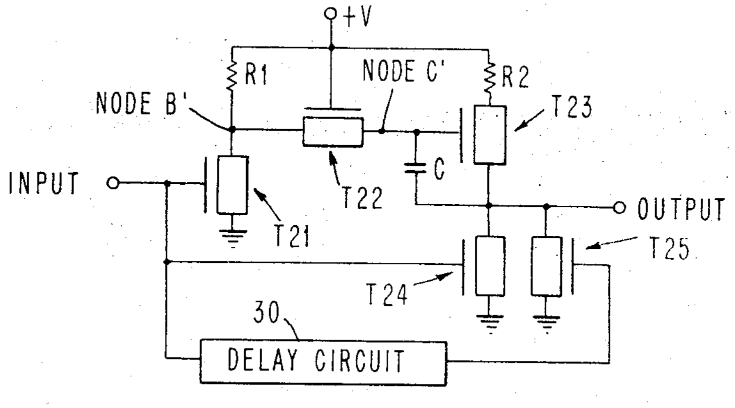
PRIOR ART FIG. 1
FIG. 1 is a circuit diagram of the prior art.

Refer now to FIG. 1 for a brief description of the prior art circuit. In the standby condition, driver output transistor T23 is held cut off and is not dissipating power. During the driving mode, the potential on the output line rises rapidly to the first source of potential +V. During standby, the signal on the input terminal is at an up level causing T21 to T24 to conduct. Nodes B' and C' are at ground potential and the driver output FET T23 is off. When the input signal falls, T21 and T24 are turned off and node B' is permitted to rise, charging node C' (capacitor C) through T22. T25 remains conducting after T24 is turned off due to the delay circuit 30. Conducting FET T25 holds the output voltage on the output line at ground potential, while the potential at node C' continues to increase. The result is a rapid rise of the gate-to-source voltage on driver FET T3. After the falling input signal passes through delay circuit 30, T25 shuts off and the voltage on the output line rises rapidly. The rising voltage is set back to node C via feedback capacitor C. Resistor R2 enhances the feedback efficiency and is optional. The potential of node C can rise to levels higher than supply potential +V inasmuch as T22 is turned off.

In order to operate the just described driver circuit at high frequencies, the delay of delay circuit 30 must be precisely controlled. An insufficient amount of delay causes the output node to rise prior to node C' being fully charged. An excessive amount of delay would unduly slow down the operation of the circuit and cause undesirable power dissipation. The output node cannot rise until both T24 and T25 are turned off. Although T24 turns off as soon as the down level input signal is applied to the input node, the output node continues to be held at a down level so long as T25 is on. Therefore, it is the precisely controlled discharge time of the gate electrode of T25 that controls the rise of the output node.

Figure 2:
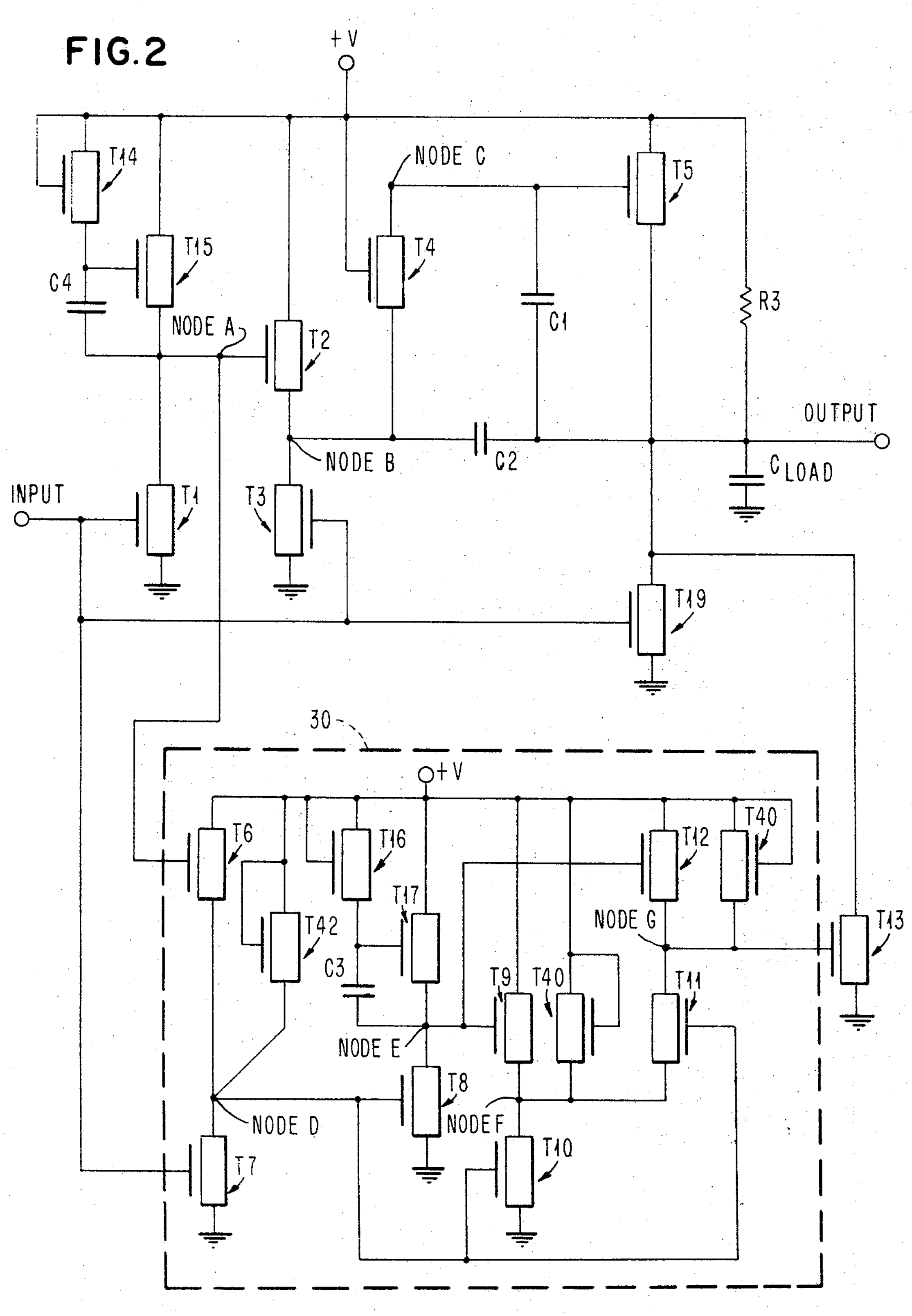
FIG. 2 is a circuit diagram of a preferred embodiment of this invention.

Refer now to FIG. 2 which shows a delay circuit 30 in accordance with the present invention. The driver circuit itself is similar to the prior art. The input signal is received on an input node and connected to the gate electrode of transistors T1, T3 and T19. The source electrodes of each of these transistors is connected to ground. Note that throughout this specification, the two gated electrodes of the FETs will be referred to as source and drain, recognizing that in many applications the terminology is interchangeable. Transistor T1 forms an inverter circuit with transistors T14, T15 and capacitor C4. The combination of transistors T14 and T15 with feedback capacitor C4 forms a linear impedance for the inverter circuit, as is well known in the art. Accordingly, the inverted input appears at node A. The gate electrode of T2 is connected to node A, while the two gated electrodes are connected between the first potential level +V and the drain of T3, the latter connection forming node B. Transistor T4 has its drain-to-source path connected between node B and node C and its gate electrode connected to the first potential level +V. Output transistor T5 has its drain-to-source path connected between the first potential level +V and the output node and its gate electrode connected to node C. Feedback capacitor C1 is connected between the gate and source of transistor T5 placing it between node C and the output node. The drain electrode of T19 is also connected to the output node. Resistor R3 is an optional high impedance resistance of approximately 10 k-ohms for maintaining the up level of the output node for up level output signals of long time duration. Capacitance C2 is connected between node B and the output node. The indicated load capacitance connected to the output node is not necessarily a discrete capacitor but rather the capacitive load of subsequent field effect transistors. Also connected to the output node in electrical parallel with T19 is T13 having its gated electrode connected between the output node and the second potential level, ground. Transistor T13 has its gating electrodes connected to the output of delay circuit 30.

Delay circuit 30 forms a parallel delay path for an input signal between the input node and the output node. The rise of the signal at the output node is precisely controlled by precisely controlling the turn off of T13. The input signal at the input node is received at the gate electrode of T7 while the inverted input signal is received at the gate electrode of T6. Transistors T6 and T7 form a series path between the first potential level +V and the second potential level ground. A common connection between these two series transistors forms node D which is also connected to the gate electrodes of T8, T10 and T11. T8 has its drain-to-source path connected between node E and ground annd together with transistors T16, T17 and capacitor C3 forms an inverter. Also connected to node E are the gating electrodes of T9 and T12. T9 has its drain-to-source path connected between potential level +V and node F while T12 has its drain-to-source path connected between potential level +V and node G. The drain-to-source path of T11 is connected between node F and node G. Node G forms the output delay circuit 30 connected to the gating electrode of T13. High impedance transistors T40 are connected between +V and nodes F and G, respectively, to assure that nodes F and G remain at an up level if up level signals of a long time duration are applied to the input node. High impedance transistor T42 is connected between +V and node D to keep node D at an up level if a long duration down level signal is applied to the input node.

Figure 3:
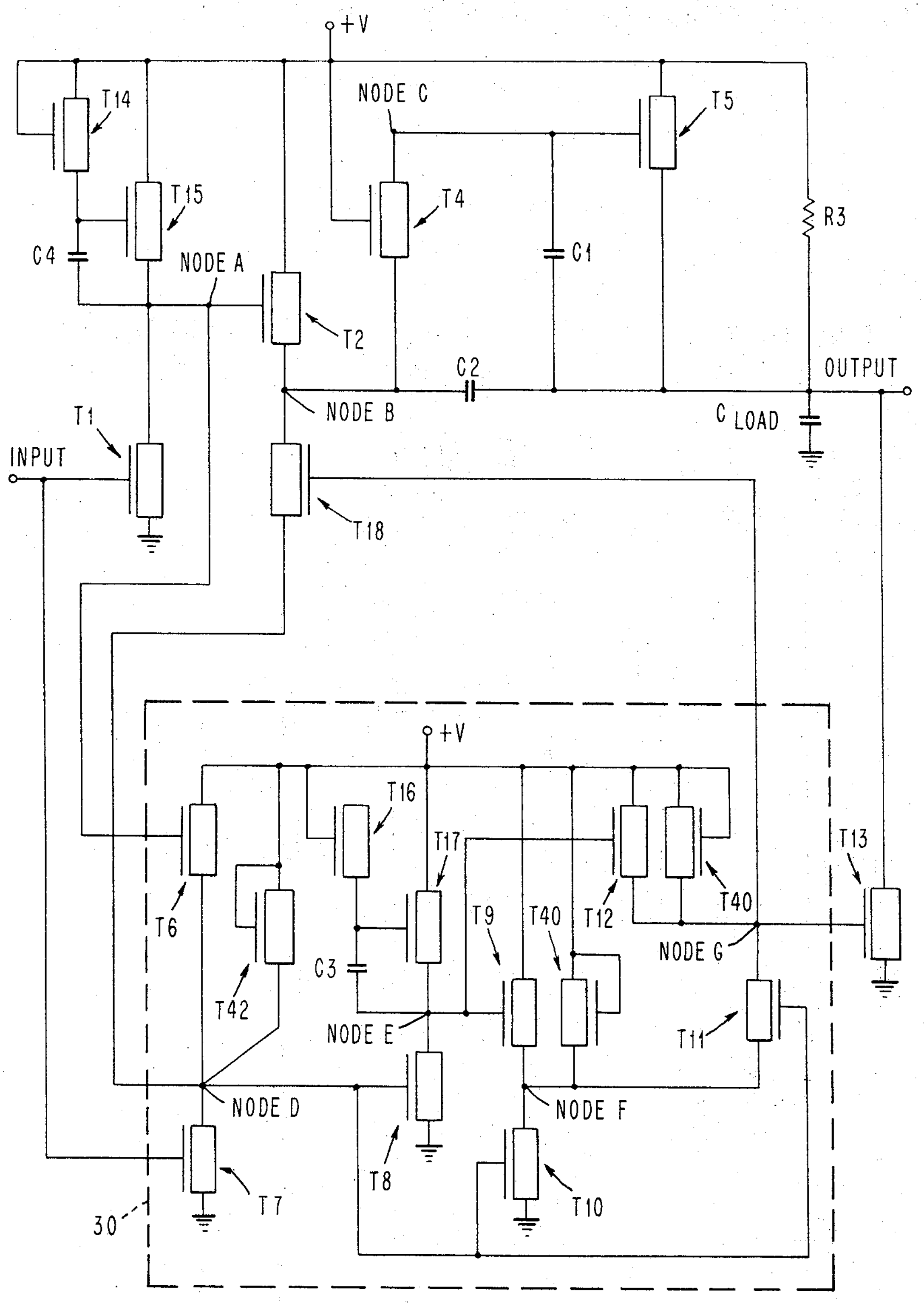
FIG. 3 is a circuit diagram of an alternate embodiment of this invention.

Refer now to FIG. 3 where corresponding items have been labelled with corresponding reference numerals insofar as practical. The primary distinction between the FIG. 2 and FIG. 3 embodiments is the addition of transistor T18, and the deletion of transistors T19 and T3. Transistor T18 has its drain-to-source path connected between node B and transistor T7, while its gating electrode is connected to node G in the delay circuit. Transistor T18 prevents node B from discharging to ground through T7 until node G is brought to an up level. Capacitor C2 connected between the output node and node B is an additional feedback capacitor for feeding back an up level signal to the second gated electrode of transistor T4. It is the function of capacitor C2 to raise the potential at node B as capacitor C1 raises the potential at node C assuring that T4 remains off, preventing current flow out of node C. C1 generally has a somewhat higher capacitance than C2. For example, if C1 has a value of 3 pf., then C2 would have a typical value of 0.5 pf. The gate to substrate capacitance of output field effect transistor T5 is also approximately 0.5 pf. Output field effect transistor T5 is intentionally designed with a low impedance in the order of 1 K-ohm to drive a capacitive node in the order of 20 pf. Capacitances C3 and C4 have values of approximately 0.5 pf. The connection of T18 prolongs the duration of the up level of the signal on the output node to be consistent with the pulse duration of the down level signal at the input node.

OPERATION

Figure 4:
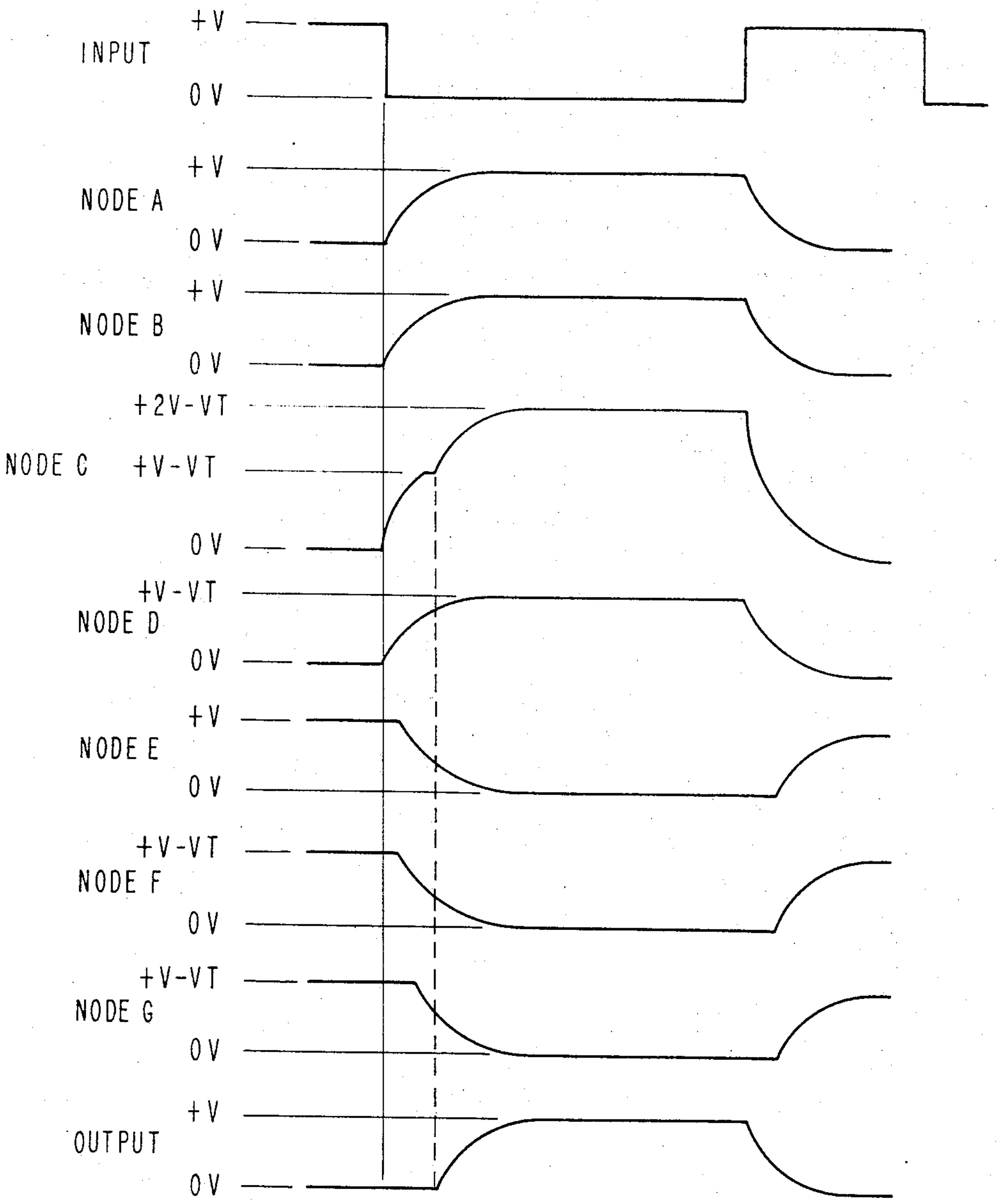
FIG. 4 is a waveform diagram illustrating the relationship of the signals at the various nodes of the FIG. 2 embodiment of the present invention.

Refer now to the waveform diagrams of FIG. 4 depicting the operation of the circuit of FIG. 2. The input is normally at an up level causing T1, T3, T7, and T19 to conduct holding nodes A, B, D, and the output node at a down level. Node B being at a down level also holds node C at a down level through transistor T4. Node D being at a down level holds transistors T8, T10, and T11 off permitting nodes E, F, and G to charge to an up level through transistors T17, T9, and T12. A down level input signal on the input node turns off transistors T1, T3, T19, and T7. This permits node A to charge to an up level through T15. This turns on T2 and T6 charging nodes B and D to an up level. It is important here to note that nodes B and D are always in phase but driven by two separate devices, T2 and T6 so that node B can be made to rise real rapidly while the rise time of node D can be adjusted by modifying the device size of T6. As will be more apparent, the device size of T6 is adjusted simultaneously with devices T10 and T11 for obtaining the optimum delay. The varying of device size, per se, to alter the transconductance and resultant rise and fall time, is well known and needs no further detailed explanation. It is noted, therefore, that even though T6 corresponds to T2 in a tracking relationship, the rise time of node D may lag the rise of node B per adjustment of the device size of T6. As further mentioned the device size of T10 and T11 (as well as T8 to some extent) determines the capacitance of node D which may result in a longer RC time constant even with the impedance of device T6 at the same value as the impedance of device T2. It is the turn of of transistor T10 and T11 which provides the discharge path for node G that regulates the turn off of T13 and the beginning of the rise of the signal on the output node.

Continuing with the foregoing description of the operation, the rise of node B results in the charging of node C through T4. Node C, however, at this point can at best rise to a threshold level below +V because of the threshold drop through T4. At this point, output transistor T5 is conditioned on, but the output node remains clamped to ground through T13. T13 has a lower impedance than T5, such as a 4:1 ratio, for example, to assure maximum potential build up across C1. In the delay circuit, the rise of node D turns on transistor T8 bringing node E to a down level and turning off T9 and T12. While T9 and T12 were on they formed charging paths for nodes F and G, respectively. The up level of node D also turns on transistors T10 and T11. Note, however, that although the gating electrodes of T10 and T11 are actuated simultaneously, T11 cannot begin to turn on until node F has been at least partially discharged through T10. Accordingly, the time of discharge of node G becomes the function of the relative discharge time of first T10, then T11 even though their gating electrodes receive simultaneously rising and gating signals. As the input signal rises again, T19 is turned on causing the output node to discharge to a down level. Thus, since the up level of the output node was delayed until node C was fully charged to a potential equal to twice the supply potential less one threshold voltage drop, the ensuing down level of the output node is not delayed at all, resulting in a shorter pulse at the output node than at the input.

The just described delay circuit, in summary, has an input circuit consisting of transistor T6 and T7 for receiving the true and complement values of the input signal. The output of the input circuit is connected to an inverter consisting of transistors T8, T16, T17, and capacitor C3. The output of the input circuit is also connected to means for discharging node G, the output node of the delay circuit, the means for discharging consisting of a series path including at least two series connected transistors T10 and T11 having a common connection node F therebetween. The output of the inverter circuit actuates a means T12, for charging node G, and a means, T9, for charging the common connection node F in the series path for discharging node G. The precise timing of discharging node G controls the turnoff of T13 providing a delayed output to the output node precisely controlling the rise of the output node. The amount of delay provided is less than if additional inverter stages were added. The discharge of node G, which is the output node of the delay circuit, is precisely controlled by the "RC" time constant wherein the "R" factor is contributed by the impedance of T6 and the "C" factor is contributed by T10 and T11. The delay is further controllable by the particular series connection of T10 and T11 whereby T11 is delayed from conduction until T10 has at least partially discharged the common connection in the series path, node F. Additional delay could be obtained by increasing the capacitance of the line as by adding a capacitor or additional devices in the series discharge path, or by increasing the impedance of T6. Conversely, a lesser amount of delay could be introduced by decreasing the impedance of T6 and the capacitance associated with the circuitry connected to node D. A further technique for increasing the amount of delay is by increasing the capacitance at node F, as by adding a discrete capacitor, for example. Since T11 is held off until T10 has had an opportunity to at least partially discharge the capacitance at node F, the delay would be increased even though T10 and T11 are conditioned to conduct simultaneously. The desired amount of delay causes T13 to turn off precisely as node C is fully charged to one threshold level below +V. If T13 turns off too soon, the full effects of feedback capacitance C1 to overcome the threshold voltage drop of T5 are not realized. A larger time delay unduly slows down the operation of the circuit and causes excessive power dissipation. Extra power is dissipated after T5 is conditioned on so long as T13 is also on, forming a DC path between +V and ground. The time duration of this DC path should therefore be minimized.

Refer now to FIG. 3 for a description of the variations of the circuit in FIG. 2. The addition of transistor T18 and the deletion of transistors T19 and T3 provide an output pulse of the same duration as if the delay circuit were not present. The output node cannot be discharged until node G is brought to an up level causing the output node to discharge through node T13. This delays the down level discharge of the output node as the up level signal was delayed. Also, T5 is held on for the entire duration by preventing node B from discharging to ground until after node G has been brought to an up level causing T18 as well as T7 to turn on in order to discharge node B. It is desirable to delay the discharge of node B, and consequently node C, to avoid coupling to the output node through capacitors C1 and C2. Accordingly, the duration of the output signal on the output node will be the same as the duration of the input signal on the input node.

The foregoing circuit may also be implemented in P channel FET technology in which case the polarity of the potential sources and waveforms within the circuit would be reversed. It is well known that P channel devices turn on with down level signals and off with up level signals. Also, the terms charging and discharging as used herein are relative terms indicating current flow into or out of a capacitance such as a capacitive node, for example. Therefore, the reversal of the occurrence of these two events would be within the intent of the present invention.

Accordingly, while the invention has been particularly shown and described with reference to preferred embodiments, it will be understood by those skilled in the art that various changes in form and detail may be made therein without departing from the spirit and scope of the invention.

What is claimed is:

1. In a field effect transistor driver circuit having input and output nodes and having an inverter stage for providing a complement value of an input signal, and an output stage for driving a capacitive load, said output stage having an output field effect transistor with drain, source and gate electrodes, and being responsive to the output of the inverter stage said output stage having a feedback capacitor connected in parallel with the gate-to-source path of said output field effect transistor for overcoming the threshold voltage drop of the output field effect transistor in the output stage, the improvement including a delay circuit connected in electrical parallel with said field effect transistor driver circuit, said delay circuit having input and output nodes and comprising:

- an input circuit for receiving true and complement values of the input signal;
- an inverter circuit responsive to the output of said input circuit;
- first means including at least two series connected field effect transistors having a common connection therebetween for discharging the output node of the delay circuit, said means being responsive to the input circuit;
- second means responsive to the inverter circuit for charging the said common connection and the output node of the delay circuit; and
- field effect transistor means responsive to the output of the delay circuit for providing a delayed input to the output node of the driver circuit.

2. A field effect transistor circuit as in claim 1 wherein the first means includes two series connected field effect transistors each having drain, source and gate electrodes, the gate electrodes being electrically connected to each other and to the output of the input circuit, whereby a first one of said two field effect transistors conducts current prior to the second one of said two field effect transistors, until said first field effect transistor at least partially discharges a capacitance at the common connection between said two series connected field effect transistors.

3. A driver circuit as in claim 1 additionally comprising:

an isolation field effect transistor having a gating electrode and first and second gated electrodes, the gating electrode being connected to a potential source, the first of said gated electrodes being connected to the feedback capacitance and the gating electrode of said output field effect transistor; and a second capacitance connected between the second gated electrode of said isolation field effect transistor and the output node of the driver circuit for assuring that leakage current does not flow through said isolation field effect transistor when the gating electrode of said output field effect transistor is raised due to the feedback potential fed back through the feedback capacitor.

4. A driver circuit as in claim 3 further comprising:

an additional field effect transistor means having first and second gated electrodes and a gating electrode, the first and second gated electrodes being connected in a series path between said isolation field effect transistor nd ground potential, the gating electrode being connected to the output node of the delay circuit.

* * * * *